[12] United States Patent
Shimizu et al.

(10) Patent No.: US 7,276,123 B2
(45) Date of Patent: Oct. 2, 2007

(54) SEMICONDUCTOR-PROCESSING APPARATUS PROVIDED WITH SUSCEPTOR AND PLACING BLOCK

(75) Inventors: Akira Shimizu, Tama (JP); Hideaki Fukuda, Tama (JP); Hiroki Arai, Tama (JP); Baiei Kawano, Tama (JP); Takayuki Yamagishi, Tama (JP)

(73) Assignee: ASM Japan K.K., Tokyo (JP)

( * ) Notice: Subject to any disclaimer, the term of this patent is extended or adjusted under 35 U.S.C. 154(b) by 326 days.

(21) Appl. No.: 10/897,061

(22) Filed: Jul. 22, 2004

(65) Prior Publication Data

US 2005/0022737 A1 Feb. 3, 2005

(30) Foreign Application Priority Data

Jul. 28, 2003 (JP) ............................. 2003-280872

(51) Int. Cl.
*C23C 16/00* (2006.01)
*H01L 21/306* (2006.01)
*C23F 1/00* (2006.01)

(52) U.S. Cl. .................. 118/719; 118/728; 118/730; 118/733; 156/345.31; 156/345.51; 156/345.54

(58) Field of Classification Search ........... 156/345.54, 156/345.31, 345.51; 118/728, 719, 730, 118/733
See application file for complete search history.

(56) References Cited

U.S. PATENT DOCUMENTS

| 5,100,502 | A | * | 3/1992 | Murdoch et al. | ........ 414/744.1 |
| 5,421,893 | A | | 6/1995 | Perlov | |
| 6,355,108 | B1 | * | 3/2002 | Won et al. | .................. 118/728 |
| 6,875,280 | B2 | * | 4/2005 | Ikeda et al. | .................. 118/719 |
| 6,955,741 | B2 | * | 10/2005 | Yamagishi | ............. 156/345.51 |
| 2003/0021657 | A1 | | 1/2003 | Yamagishi | |
| 2006/0075972 | A1 | * | 4/2006 | Nakashima et al. | ........ 118/729 |

FOREIGN PATENT DOCUMENTS

JP 06-318630 11/1994

OTHER PUBLICATIONS

U.S. Appl. No. filed May 7, 2004, Baiei Kawano.

* cited by examiner

*Primary Examiner*—Karla Moore
(74) *Attorney, Agent, or Firm*—Knobbe, Martens, Olson & Bear LLP

(57) ABSTRACT

A semiconductor-processing apparatus comprises a susceptor and removable placing blocks detachably placed at a periphery of the susceptor for transferring a substrate. Retractable supporting members are provided for detaching/attaching the placing blocks from/to the susceptor.

33 Claims, 10 Drawing Sheets

SEMICONDUCTOR-PROCESSING APPARATUS PROVIDED WITH SUSCEPTOR AND PLACING BLOCK

BACKGROUND OF THE INVENTION

1. Field of the Invention

The present invention generally relates to a semiconductor-processing apparatus, and particularly to a semiconductor-processing apparatus in which a substrate is moved between a reaction area and a transfer area by moving a susceptor up and down.

2. Description of the Related Art

As high integration of semiconductor devices has progressed, ALCVD (Atomic Layer Chemical Vapor Deposition) having better thin film formation controllability than CVD (Chemical Vapor Deposition) has received increased attention.

ALCVD is a thin film formation method for forming a thin film by introducing multiple source gases alternately or in order into a reactor and causing the source gases adsorb to a surface of a semiconductor wafer. In this method, because thin film formation is performed using only an adsorption layer, controlling film formation at a film thickness of several molecules is possible. Additionally, this method demonstrates a satisfactory step coverage characteristic.

When a thin film is formed by ALCVD, evacuating a source gas used until that time from within the reactor is required at the time of source gas switching. If any previously-used source gas remains in the reactor, a CVD reaction may occur in vapor phase, thereby making it difficult to control a film thickness at a molecular layer level. Additionally, fine particles generated by a CVD reaction in vapor phase may cause particle contamination.

If a purge time for eliminating a remaining gas completely from within the reactor lengthens, throughput declines. Given this factor, in conventional semiconductor-processing apparatuses, the inside of the chamber is divided into a reaction area and a transfer area to reduce dead space as well as to shorten the purge time.

Conventional semiconductor-processing apparatuses are configured, for example, as shown in FIG. 11 (e.g., Japanese Patent Laid-open No. 1994-318630).

The semiconductor-processing apparatus shown in FIG. 11 comprises a chamber 100 and a drive portion 200. In the chamber 100, a susceptor 102 for placing a semiconductor wafer 101, which is an object to be processed, on it is provided movably up and down. The drive portion 200 is rotated and driven along with the susceptor 102 moving up and down.

FIG. 11 shows a position in which the susceptor 102 is in a processing position (an ascent position). In this position, the upper surface of the outer peripheral portion of the susceptor 102 contacts the undersurface of the inner circumference of a separation plate (base ring) 103; by this, the inside of the chamber 100 is divided into a reaction area (a reactor) 104 and a transfer area 105.

The susceptor 102 hangs multiple (normally three) lift pins 106 movably up and down. When the susceptor 102 goes down, the lift pins 106 go down together with it. When the lift pins 106 go down together with the susceptor 102 and their lower edges bump into a cradle 107 for supporting use, the lift pins 106 stop going down at that point. Subsequently, when the susceptor 102 further goes down toward a transfer position (a descent position), the lift pins 106 go up relatively to the susceptor 102. As a result, the lift pins 106 lift the semiconductor wafer 101 placed on the susceptor 102 up from the susceptor 102.

The semiconductor wafer 101 lifted up from the susceptor 102 by the lift pins 106 can be carried out of the chamber 100 through an access port 108 by a transfer arm (a manipulator) not shown in the figure.

Additionally, by the actions in reverse order to the above-mentioned, a new semiconductor wafer to be processed next can be introduced into the chamber.

In a conventional semiconductor-processing apparatus, a reaction area and a transfer area are divided by physically contacting a susceptor with a base ring. However, placing the susceptor and the base ring in contact with each other without a gap is exceedingly difficult because it requires, for example, parallelizing contact surfaces of the susceptor and the base ring with precision and so forth. Additionally, in the conventional semiconductor-processing apparatus, because a lift pin is inserted movably up and down into a through-bore formed in the susceptor, a gap exists between the lift pin and the through-bore. Consequently, the conventional semiconductor-processing apparatus has a problem that the reaction area and the transfer area cannot be divided airtightly.

If the reaction area and the transfer area are not divided airtightly, a reaction gas flows into the transfer area from the reaction area; because evacuating the reaction gas having flowed in becomes difficult, a purge time is lengthened. Further, because the reaction gas reacts with a secondly-introduced reaction gas in CVD, particle contamination is caused. Additionally, because a thin film is formed inside the transfer area, a maintenance cycle is shortened.

Although a flow of a reaction gas passing through the gap between the lift pin and the through-bore can be blocked or reduced by reducing the gap, this increases wear debris, thereby causing particle contamination.

Additionally, in the conventional semiconductor-processing apparatus, there is another problem: If a pressure inside the reaction area becomes lower than a pressure inside the transfer area (e.g., when a reaction gas is evacuated), a semiconductor wafer rises being affected by a gas passing through a gap between the lift pin and the susceptor and moves, thereby generating wear dust and causing particle contamination.

SUMMARY OF THE INVENTION

In view of the above, as a countermeasure, it is possible to seal a gap existing between the susceptor and the base ring using an O-ring means. However, although the O-ring means is effective when a temperature is relatively low (e.g., 200° C.), it cannot be used at a relatively high temperature (e.g., 300° C.). Additionally, this method has no effect on a gap existing between the lift pin and the through-bore.

Although the present invention is not limited to the following objects, given the factors above, an object of the present invention is to provide a semiconductor apparatus capable of dividing a reaction area and a transfer area inside the chamber airtightly.

Another object of the present invention is to provide a method for introducing a semiconductor wafer, which enables to divide a reaction area and a transfer area inside the chamber airtightly.

The present invention can solve one or more problems described above, and in an aspect, the present invention provides a semiconductor-processing apparatus comprising: (i) a chamber prescribing a reaction area and a transfer area;

(ii) a susceptor provided inside the chamber and having a substrate-supporting surface for placing a semiconductor substrate thereon, said susceptor being movable between the reaction area and the transfer area; (iii) an annular separation plate disposed at a boundary between the reaction area and the transfer area and having a central opening which is closed by upward movement of the susceptor; (iv) removable placing blocks detachably placed at a periphery of the substrate-supporting surface of the susceptor, for placing the substrate thereon; (v) retractable supporting members each for supporting/releasing the placing blocks at a position where the substrate is in the transfer area to detach/attach the placing blocks from/to the susceptor, said supporting members being provided in the chamber outside a periphery of the susceptor where the supporting members do not interfere with movement of the susceptor when the supporting members are retracted; and (vi) a seal member for sealing a gap between the susceptor and the separation plate when the central opening of the separation plate is closed by the susceptor.

The above aspect further includes, but is not limited to, the following embodiments:

The placing blocks may be configured to be supported on the supporting members when the placing blocks are separated from the susceptor. Each placing block may have an inner side to be fitted to the periphery of the substrate-supporting surface of the susceptor and an outer side to be in contact with the supporting member, said outer side having a recess where the supporting member enters to support the placing block. The inner side of the placing block may have a convex/concave and the susceptor has a concave/convex corresponding to the convex/concave of the inner side of the placing block.

The supporting member may comprise a retractable arm for supporting/releasing the placing block. The retractable arm may be comprised of a rotatable arm and a drive shaft, wherein the rotatable arm moves on a plane perpendicular to an axis of the susceptor. The rotatable arm may not move in a direction of the axis of the susceptor. The rotatable arm may have a convex/concave and the placing block has a concave/convex on the outer side corresponding to the convex/concave of the rotatable arm. The plane perpendicular to the axis of the susceptor may be disposed at a substrate-transferring position.

The placing blocks may be placed around the periphery of the substrate-supporting surface of the susceptor at equal intervals. The placing blocks may be placed symmetrically with respect to a center of the substrate-supporting surface of the susceptor. The number of the placing blocks may be two. Each placing block may have a length along the periphery of the substrate-supporting surface of the susceptor, which is about 1/16 to about 1/6 of the length of the periphery of the substrate-supporting surface of the susceptor.

The seal member may be provided on a backside of the separation plate.

The susceptor may have a first annular steps outward of the substrate-supporting surface for mounting the placing blocks thereon, and a second annular step outward of the first annular step for contacting a backside of the separation plate. The substrate-supporting surface of the susceptor may have no hole for pin rifting.

The apparatus may further comprise a buffer mechanism for simultaneously placing the substrate, which is a first substrate, and a second substrate inside the chamber. The buffer mechanism may comprise retractable arms for supporting the second substrate, said retractable arms being movable between an initial position where the second substrate is loaded on the retractable arms and an upper position where the first substrate is unloaded from the placing blocks. The retractable arms may be disposed where the retractable arms do not interfere with movement of the susceptor when the retractable arms are retracted. Each retractable arm may be comprised of a rotatable arm and a drive shaft, wherein the rotatable arm moves on a plane perpendicular to an axis of the susceptor.

In another aspect, the present invention provides a semiconductor-processing apparatus comprising: (i) a chamber prescribing a reaction area and a transfer area; (ii) a susceptor provided inside the chamber for placing a semiconductor wafer thereon; (iii) an elevating drive for moving the susceptor in a given direction; (iv) an annular separation plate disposed at a boundary between the reaction area and the transfer area and having a central opening to be closed by movement of the susceptor; (v) a placing block for placing the semiconductor wafer thereon, which is detachably attached to the susceptor; (vi) a supporting member for supporting/releasing the placing block in a given position and detaching/attaching the placing block from/to the susceptor; and (vii) a seal member provided on a surface of the separation plate facing the susceptor and used for sealing a gap between the susceptor and the separation plate when the susceptor closes the opening of the separation plate.

The above aspect further includes, but is not limited to, the following embodiments:

The seal member may be an O-ring, bellows, or a coil spring covered with an aluminum material having a C-shaped section. The placing block may comprise the same material as a material used for a top portion of the susceptor. The material may be surface anode-treated aluminum oxide, aluminum oxide, aluminum nitride, silicon carbide, graphite, or quartz. The supporting member may be provided outside a moving space of the susceptor and comprises multiple supporting arms respectively having a tip capable of advancing/retracting with respect to the moving space.

The apparatus may further comprise a buffer mechanism for allowing the semiconductor wafer and a second semiconductor wafer to simultaneously exist inside the chamber, said buffer mechanism being provided for supporting the second wafer independently of the placing block and the supporting means. The buffer mechanism may be provided outside a moving space of the susceptor and comprises (I) multiple holding arms respectively having a tip capable of advancing/retracting with respect to the moving space and (II) a moving member for moving the multiple arms in a given direction.

In still another aspect, the present invention provides a semiconductor-processing apparatus comprising: (i) a chamber prescribing a reaction area and a transfer area; (ii) a susceptor having a substrate-supporting surface for placing a semiconductor substrate thereon, said susceptor being provided inside the chamber and movable in its axis between a top position and a bottom position via an intermediate position, said substrate-supporting surface having no throughhole; (iii) an annular separation plate disposed at a boundary between the reaction area and the transfer area and having a central opening to be closed by movement of the susceptor, said separation plate having a backside provided with a seal member for sealing a gap between the separation plate and the susceptor when at the top position; and (iv) placing blocks for placing the substrate thereon, said placing blocks detachably attached to the susceptor, wherein the placing blocks moves together with the susceptor while the susceptor moves between the top position and the intermediate position, and the placing blocks stays at the intermediate position while the susceptor moves between the intermediate position and the bottom position, wherein the substrate is loaded and unloaded when the susceptor is at bottom position.

The above aspect further includes, but is not limited to, the following embodiments:

The apparatus may further comprise retractable supporting members each for supporting/releasing the placing blocks at the intermediate position to detach/attach the placing blocks from/to the susceptor, wherein the supporting members are provided in the chamber outside a periphery of the susceptor where the supporting members do not interfere with movement of the susceptor when the supporting members are retracted.

In yet another aspect, the present invention provides a semiconductor-processing apparatus comprising: (i) a chamber prescribing a reaction area and a transfer area; (ii) a susceptor having a substrate-supporting surface for placing a semiconductor substrate thereon, said susceptor being provided inside the chamber and movable in its axis between a top position and a bottom position via an intermediate position, said substrate-supporting surface having no throughhole; (iii) an annular separation plate disposed at a boundary between the reaction area and the transfer area and having a central opening to be closed by movement of the susceptor, said separation plate having a backside provided with a seal member for sealing a gap between the separation plate and the susceptor when at the top position; (iv) placing blocks for placing the substrate thereon, said placing blocks detachably attached to the susceptor, wherein the placing blocks is movable together with the susceptor, and the placing blocks is detached or attached to the susceptor at the intermediate position; (v) a buffer mechanism for simultaneously placing the substrate, which is a first substrate, and a second substrate inside the chamber.

The above aspect further includes, but is not limited to, the following embodiments:

The buffer mechanism may comprise retractable arms for supporting the second substrate, said retractable arms being movable between the intermediate position where the second substrate is loaded on the retractable arms and an upper position where the first substrate is unloaded from the placing blocks. The retractable arms may be disposed where the retractable arms do not interfere with movement of the susceptor when the retractable arms are retracted.

Additionally, in another aspect, the present invention provides a semiconductor-processing apparatus comprising a chamber, a vertically movable susceptor, removable placing blocks detachably placed at a periphery of the susceptor for supporting a substrate, and retractable supporting members for detaching/attaching the placing blocks from/to the susceptor. The susceptor may have a substrate-placing surface and an annular step around the substrate-placing surface for detachably mounting the placing blocks thereon.

In the foregoing embodiments and aspects of the present invention, any element used in an embodiment or aspect can be interchangeably used in another embodiment or aspect as long as it is feasible. No restriction should not be imposed on selecting elements between embodiments or aspects. In particular, any of the dependent features described above should be able to be used in any of the independent configurations.

The present invention also relates to a method of using the semiconductor-processing apparatus described above, comprising: (a) positioning the susceptor with the placing blocks in a block-attaching/detaching position; (b) moving the supporting members toward the susceptor to support the placing blocks; (c) moving the susceptor downward from the block attaching/detaching position to a transfer position, thereby detaching the placing blocks from the susceptor; (d) introducing a semiconductor substrate into the transfer area and placing the substrate on the placing block; (e) moving the susceptor upward from the transfer position to the block attaching/detaching position, thereby attaching the placing blocks to the susceptor; (f) moving the supporting members away from the susceptor to release the placing blocks on the susceptor; and (g) moving the susceptor with the placing blocks and the substrate upward to a reaction position where the substrate is placed in the reaction area and the gap between the separation plate and the susceptor is sealed with the seal member.

The above method further includes, but is not limited to, the following embodiments:

The method further comprises: (h) moving the susceptor with the placing blocks and the substrate downward from the reaction position to the block attaching/detaching position; (i) moving the supporting members toward the susceptor to support the placing blocks; (j) moving the susceptor downward from the block attaching/detaching position to the transfer position, thereby detaching the placing blocks from the susceptor; and (k) transferring the substrate from the placing blocks out of the transfer area.

In another aspect, the present invention provides a method of using the semiconductor-processing apparatus described above, comprising: (a) moving downward the susceptor with the placing blocks on which the substrate is placed from a top position to a bottom position via an intermediate position, wherein the substrate is in the reaction area when the susceptor is at the top position; (b) introducing the second substrate into the transfer area and placing the second substrate on the buffer mechanism; (c) moving upward the second substrate by the buffer mechanism above the intermediate position; (d) moving upward the susceptor to the intermediate position and supporting the placing blocks by the supporting members; (e) moving downward the susceptor to the bottom position, thereby detaching the placing blocks from the susceptor, wherein the substrate is placed on the placing blocks at the intermediate position; (f) transferring the substrate from the placing blocks out of the transfer area; (g) moving downward the buffer mechanism and the second substrate, thereby placing the second substrate on the placing blocks; (h) moving upward the susceptor to the intermediate position, thereby attaching the placing blocks to the susceptor to place the second substrate on the placing blocks and the susceptor; and (i) moving upward the susceptor and the placing blocks on which the second substrate is placed to the top position.

In still another aspect, the present invention provides a method of using the semiconductor-processing apparatus of claim 22, comprising: (a) positioning the susceptor and the placing block attached thereto in a block-attaching/detaching position; (b) supporting the placing block by the supporting member; (c) moving downward the susceptor from the block attaching/detaching position to a transfer position, thereby detaching the placing block from the susceptor; (d) introducing a wafer into the transfer area and placing the wafer on the placing block; (e) moving upward the susceptor from the transfer position to the block attaching/detaching position, thereby attaching the placing block to the susceptor and releasing the placing block from the supporting member; and (f) moving upward the susceptor with the placing block to a reaction position, thereby sealing a gap between the separation plate and the susceptor and positioning the wafer in the reaction area.

The above method further includes, but is not limited to, the following embodiments:

The method may further comprise: (g) moving downward the susceptor, the placing block attached thereto, and the wafer placed thereon to the block attaching/detaching position; (h) supporting the placing block by the supporting member; (i) moving downward the susceptor from the block attaching/detaching position to the transfer position, thereby detaching the placing block from the susceptor; and j) transferring the wafer from the placing block out of the transfer area.

In yet another aspect, the present invention provides a method of using the semiconductor-processing apparatus of claim 22, comprising: (a) after a desired reaction is complete in the reaction area, moving downward the susceptor, the placing block attached thereto, and the wafer placed thereon to a block attaching/detaching position; (b) supporting the placing block by the supporting member; (c) moving downward the susceptor from the block attaching/detaching position to a transfer position, thereby detaching the placing block from the susceptor; (d) transferring the wafer from the placing block out of the transfer area; (e) introducing another wafer into the transfer area and placing the other wafer on the placing block; (f) moving upward the susceptor from the transfer position to the block attaching/detaching position, thereby attaching the placing block to the susceptor and releasing the placing block from the supporting member; and (g) moving upward the susceptor with the placing block to a reaction position, thereby sealing a gap between the separation plate and the susceptor and positioning the other wafer in the reaction area.

Further, in another aspect, the present invention provides a method of using the semiconductor-processing apparatus described above, comprising: (a) moving the susceptor, the placing block attached thereto, and a wafer placed thereon from the reaction area to a transfer position; (b) introducing another wafer into the transfer area and placing the other wafer on the buffer mechanism; (c) moving upward the other wafer by the buffer mechanism; (d) moving upward the susceptor to a block attaching/detaching position and supporting the placing block by the supporting member; (e) moving downward the susceptor to the transfer position, thereby detaching the placing block from the susceptor; (f) transferring the wafer placed on the placing block out of the transfer area; (g) moving downward the other wafer by the buffer mechanism to place the other wafer on the placing block; (h) moving upward the susceptor to the block attaching/detaching position, thereby attaching the placing block to the susceptor; (i) releasing the supporting member from the placing block; and j) moving upward the susceptor, the placing block, and the other wafer to a reaction position, thereby placing the other wafer in the reaction area and sealing a gap between the separation plate and the susceptor.

In the foregoing embodiments and aspects of the present invention, any element used in an embodiment or aspect can be interchangeably used in another embodiment or aspect as long as it is feasible. No restriction should not be imposed on selecting elements between embodiments or aspects. In particular, any of the dependent features described above should be able to be used in any of the independent steps.

For purposes of summarizing the invention and the advantages achieved over the related art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

Explanation of symbols used is as follows: 10: Chamber; 11: Reaction area; 12: Transfer area; 13: Container; 14: Separation plate; 15: Exhaust duct; 16: Showerhead; 17: Lid; 18: Heater; 19: Susceptor; 20: Placing block; 21:

Supporting mechanism; 22: Seal mechanism; 30: Drive portion; 31: Stem; 32: Guide plate; 33: Bellows; 34: Guide; 61: Buffer mechanism; 62: Rotary actuator; 63: Rotary actuator; 64: Cylinder mechanism; 81: Unprocessed semiconductor wafer; 100: Chamber; 101: Semiconductor wafer; 102: Susceptor; 103: Separation plate; 104: Reaction Area; 105: Transfer Area; 106: Lift pin; 107: Cradle for supporting use; 108: Access port; 200: Drive portion.

DETAILED DESCRIPTION OF THE PREFERRED EMBODIMENT

The invention will be explained further with reference to specific embodiments, but the invention should not be limited thereto.

Preferred embodiments of the present invention are described below by reference to figures attached.

Figure 1A:
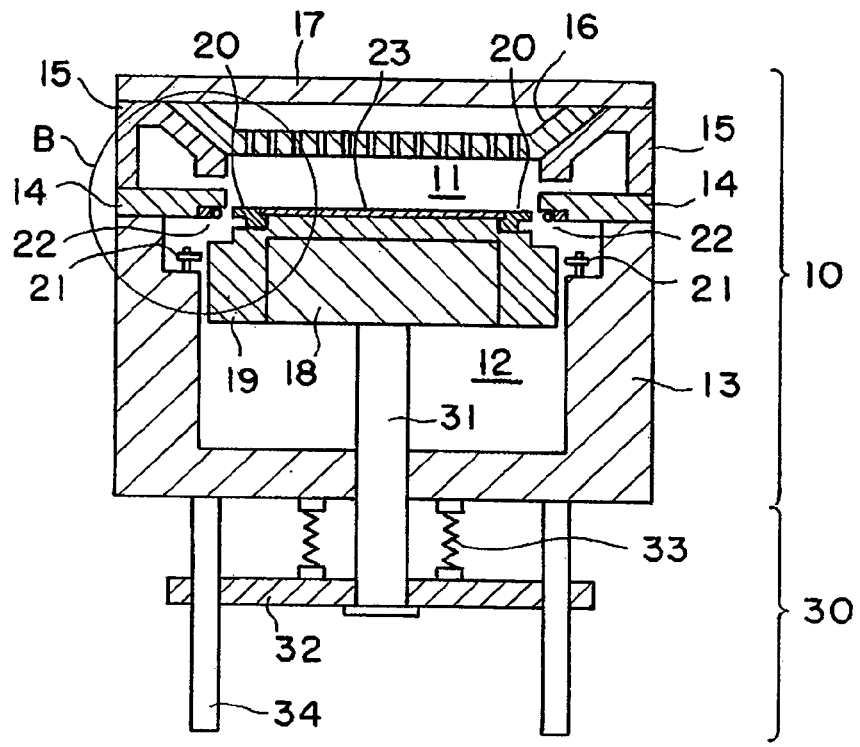
FIG. 1(a) is a cross-sectional view showing a schematic configuration of the semiconductor-processing apparatus according to Embodiment 1 of the present invention.
Figure 1B:
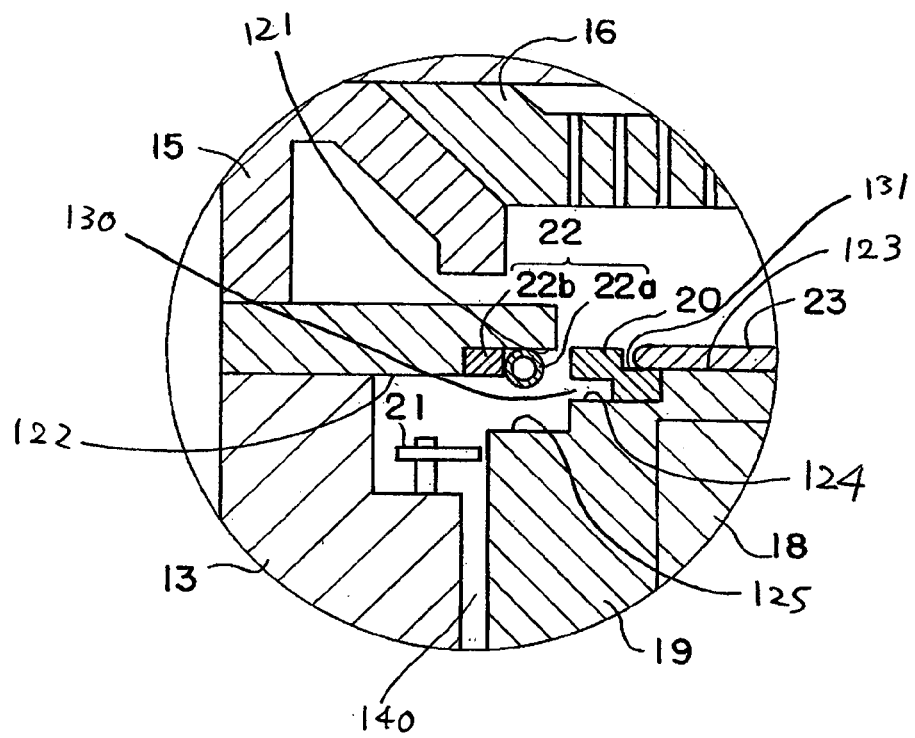
FIG. 1(b) is an enlarged view of the inside of Circle B in FIG. 1(a).

FIG. 1(a) is a cross-sectional view showing a schematic configuration of the semiconductor-processing apparatus according to Embodiment 1 of the present invention. FIG. 1(b) is an enlarged view of the inside of Circle B in FIG. 1(a).

The figures do not show electrodes and an RF power source. However, the present invention can be applied to any semiconductor-processing apparatus including, but not limited to, a plasma or thermal CVD apparatus, preferably an ALCVD apparatus. For ALCVD, complete separation of the reaction area and the transfer area is very important, and the present invention is suitably applied therefore. Since ALCVD can be conducted with or without plasmas, depending on the type of reaction gas, the apparatus need not be equipped with electrodes. In the case of plasma CVD, the shower plate and the susceptor serve as electrodes which are connected to RF power sources provided outside the chamber. Not only a susceptor but also a shower plate may be equipped with a heater (and a cooling system), which is omitted from the figures.

As shown in FIGS. 1(a) and (b) this semiconductor-processing apparatus has a chamber 10 and a drive portion 30.

The chamber 10 possesses a container 13 prescribing a reaction area 11 and a transfer area 11 to be positioned side by side in upward and downward directions of the figure, an annular separation plate 14 fixed at the upper end of the container 13, an annular exhaust duct 15 formed on the separation plate 14, a showerhead 16 for introducing a source gas into the reaction area 11, a lid 17, a susceptor 19 having a heater 18 built-in and disposed movably up and down inside the container 13, a placing block 20 detachably attached to the susceptor 19, supporting mechanisms 21 supporting the placing block 20 when detached from the susceptor 19, and a seal mechanism 22 provided at the undersurface of the inner circumference edge of the separation plate 14.

Additionally, the drive portion 30 has a stem 31 the upper edge of which is fixed in the susceptor 19, a guide plate 32 in which the lower edge of the stem 31 is fixed, a bellows 33 provided between the undersurface of the container 13 and the guide plate so as to cover the stem 31, and a guide 34 one edge of which is fixed in the undersurface of the container 13 and which is inserted into a hole provided in the guide plate 32.

The drive portion 30 functions as an elevating means for moving the susceptor 19 in the upward and downward directions of the figure together with a drive source, etc. for driving the stem 31 in the upward and downward directions of the figure. The susceptor 19 is moved by this elevating means from a reaction position (an ascent position) to a transfer position (a descent position). Additionally, a block attaching/detaching position exists between the reaction position and the transfer position.

A position of the susceptor 19 is adjusted to allow a gap of 0.2-4 mm to be created with the separation plate 14 when it is positioned in the reaction position. This adjustment is achieved by a thickness of the separation plate 14. Additionally, a gap between the separation plate 14 and the exhaust duct is 0.2-4 mm as well and this gap is also adjusted by a thickness of the separation plate 14.

A gap between the susceptor 19 and the separation plate 14 when the susceptor is in the reaction position is sealed by the seal mechanism 22. The seal mechanism 22 comprises a seal member 22a and a fixing member 22b fixing the sealing member 22a in a surface facing the susceptor of the separation plate 14. As the seal member 22a, depending on a temperature of the susceptor 19 (e.g., 50-500° C.), an O-ring-shaped gasket produced by plating an O-ring, bellows or coil spring with aluminum having a C-shaped section may be used.

Figure 5A:
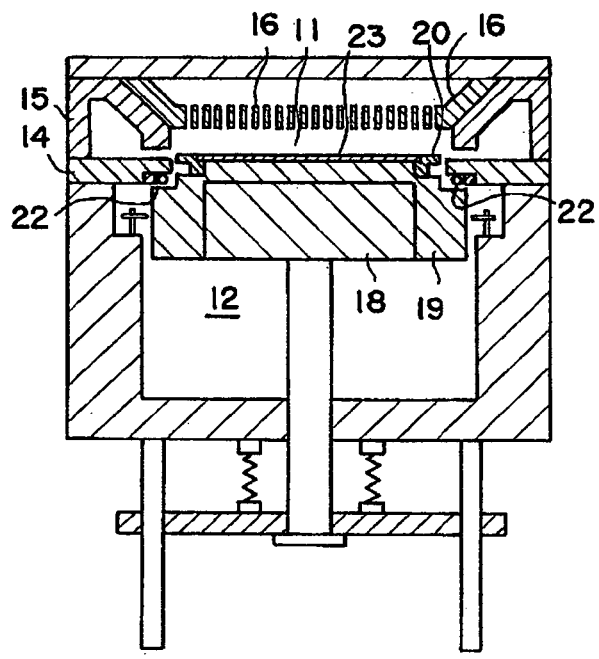
FIGS. 5(a)-(d) are process drawings for illustrating the operation of carrying out the semiconductor wafer from the chamber according to an embodiment of the present invention.

The O-ring-shaped gasket may comprise a tubular coil spring which is covered by a metal having a C-shaped cross section, wherein sealing is achieved when the surface of a step portion 125 of the susceptor 19 or a bottom surface 122 of the separation plate 14 and the gasket are engaged and the gasket is pressed when the susceptor 19 ascends to a reaction position (e.g., FIG. 5(a) inside the reaction chamber by the elevating device 30 to form a thin film on the substrate, and wherein sealing is achieved. The bottom surface of the separation plate 14 may have a step portion 121 and the gasket can be provided on the step portion 121.

In an embodiment, the gasket may be attached on the bottom surface 122 of the separation plate so that an exposed portion of the coil spring faces an outer periphery direction, thereby preventing the coil spring from contacting reaction gas. The metallic coating may be constituted by a heat-resistant and corrosion-resistant metal material. The metallic coating may be constituted by aluminum.

In the embodiment shown in FIG. 1(b), the susceptor 19 has two annular steps outward of a top surface 123, i.e., a placing surface. On a first step 124, the placing block 20 is placed, and the seal member 22 is pressed between the step portion 121 of the separation plate 14 and a second step 125. The placing block 20 has a surface 131 which is an extension of the placing surface 123 of the susceptor 19. The substrate-supporting surface need not be flat but can be caved wherein the substrate is substantially not in contact with the placing surface 123. The surface 131 is in contact with the substrate.

In a preferred embodiment, the placing block 20 has a recess 130 which receives the supporting mechanism 21 so that the supporting mechanism 21 can support the placing block 20 when the placing block is separated from the susceptor.

The supporting mechanism 21 need not move in a direction perpendicular to the axis of the susceptor, because the susceptor moves in the axial direction and detachment/attachment of the placing block can be accomplished by movement of the susceptor. However, the supporting mechanism 21 can move in the axial direction as described later with respect to a buffer mechanism, so that the susceptor need not move when transferring a wafer from the susceptor.

Further, the mechanism using the placing blocks can be applied to an apparatus without a separation plate, i.e., an apparatus having a structure where a transfer area is disposed next to the reaction area, i.e., a side-by-side arrangement.

Figure 2:
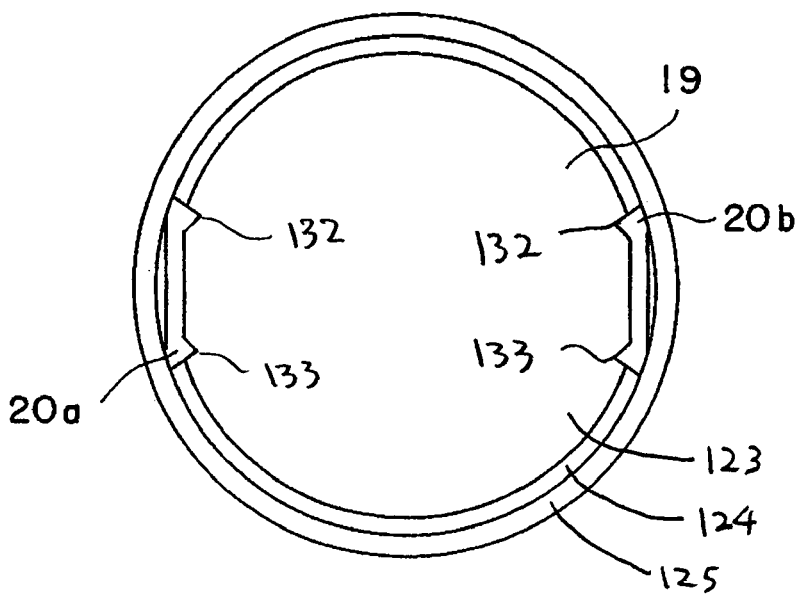
FIG. 2 is a plane view for illustrating the relation between the placing block and the susceptor according to an embodiment of the present invention.

Referring to FIG. 2, the placing block 20 comprises a pair of block members 20a and 20b symmetrically disposed with respect to the center of the susceptor 19. These block members 20a and 20b are attached to the upper edge of the susceptor 19 and mounted on the first annular step 124 so that at least partial upper surfaces of block members are level with the top surface of the susceptor (the placing surface 123). The number of the block members is not limited to two, and as long as the block members can support the wafer stably, and they do not interfere with loading and unloading of wafers, it can be more than two (e.g., 3, 4, 5) or one if the length of the block member is sufficient for supporting a wafer.

In a preferably embodiment, each block member may have a length along the periphery of the placing surface of the susceptor, which is about 1/20 to about 1/4 (preferably about 1/16 to about 1/6, further about 1/12 to about 1/8) of the length of the periphery of the placing surface of the susceptor. If the length is long, the block member preferably has a curved shape along the periphery of the susceptor.

These block members 20a, 20b are produced using the same material as used for the top (the top surface) of the susceptor 19. As a material, for example, aluminum, surface anode aluminum oxide (anodic treatment aluminum), aluminum oxide, aluminum nitride, silicon carbide, graphite or quartz may be used.

A semiconductor wafer 23 which is an object to be processed is placed on the placing surface formed by the susceptor 19 and the placing block 20 attached to the susceptor 19. In this regard, the placing block 20 is able to support the semiconductor wafer 23 in a position in which the placing block 20 is detached from the susceptor 19 (in a position in which the placing block is supported by the supporting mechanisms 21).

The placing block 20 is detached/attached from/to the susceptor 19 using the supporting mechanisms 21. In a preferred embodiment, the attachment of the placing block 20 to the edge of the susceptor can be accomplished by movement of the supporting mechanism 21. That is, the placing block 20 can always be placed at the same position in contact with the edge of the susceptor when being pushed by the supporting mechanism 21. In a preferable embodiment, the block members 20a and 20b each have two convexes 132, 133 which are fitted in the peripheral shape of the susceptor so that the placing block does not get out of position. Due to the convexes, even if the position of the placing block is slightly out of place, such a misposition can be fixed by pushing the placing block by the supporting mechanism 21 toward the susceptor. The block member can have more than two concaves or convexes or only one concave or convex or a combination of the foregoing. However, the placing surface 131 of the block member is sufficient for stably supporting the wafer thereon without the placing surface 123 of the susceptor, and when the two convexes 132, 133 are used, the wafer can be supported by the convexes 132, 133 and a middle portion of the block member, i.e., by three points.

Figure 3:
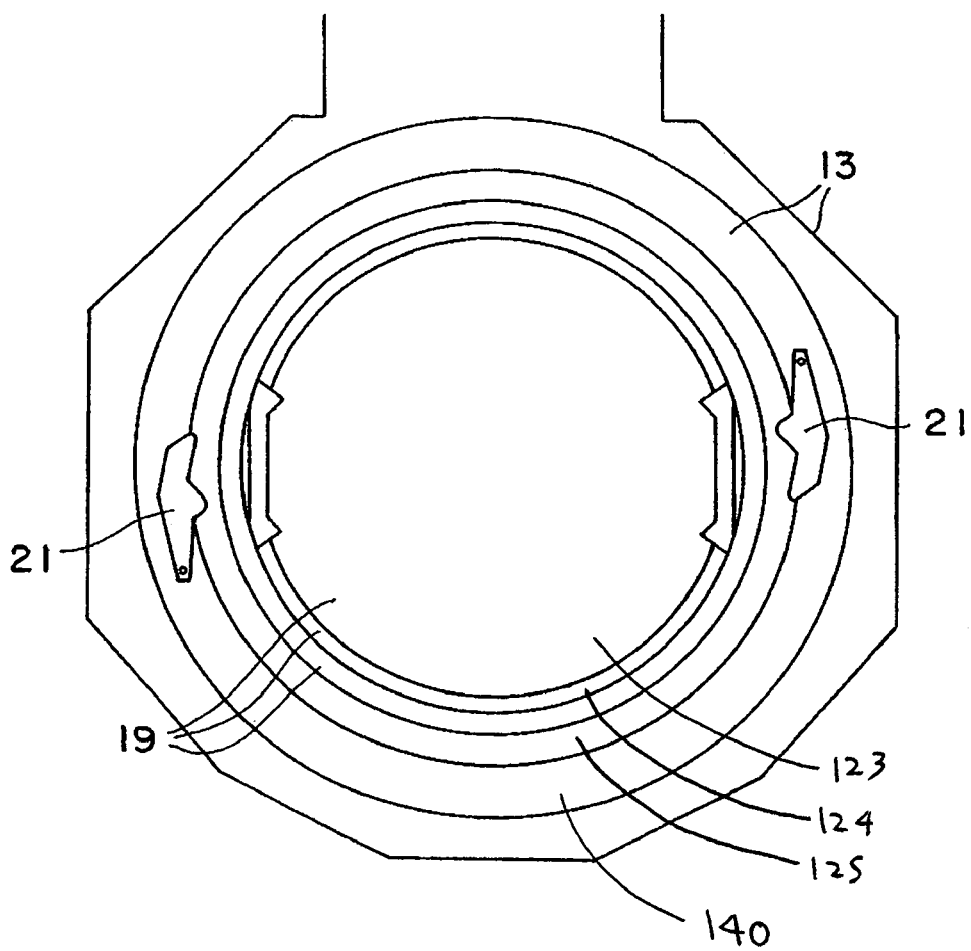
FIG. 3 is a plane view for illustrating a layout of the supporting means according to an embodiment of the present invention.

As shown in FIG. 3, a pair of the supporting mechanisms 21 is provided over a step portion disposed in an upper portion of the container 13 without hindering the susceptor 19 from moving up and down. That is, in this embodiment, there is a gap 140 (a moving space) between the susceptor 19 and the container 13, and an innermost portion of the supporting mechanism 21 is in the gap 140 when the supporting mechanism is retracted. The number of the supporting arms need not be identical to the number of the block members. If the block member is long, it can be supported by two or more supporting arms.

Figure 4:
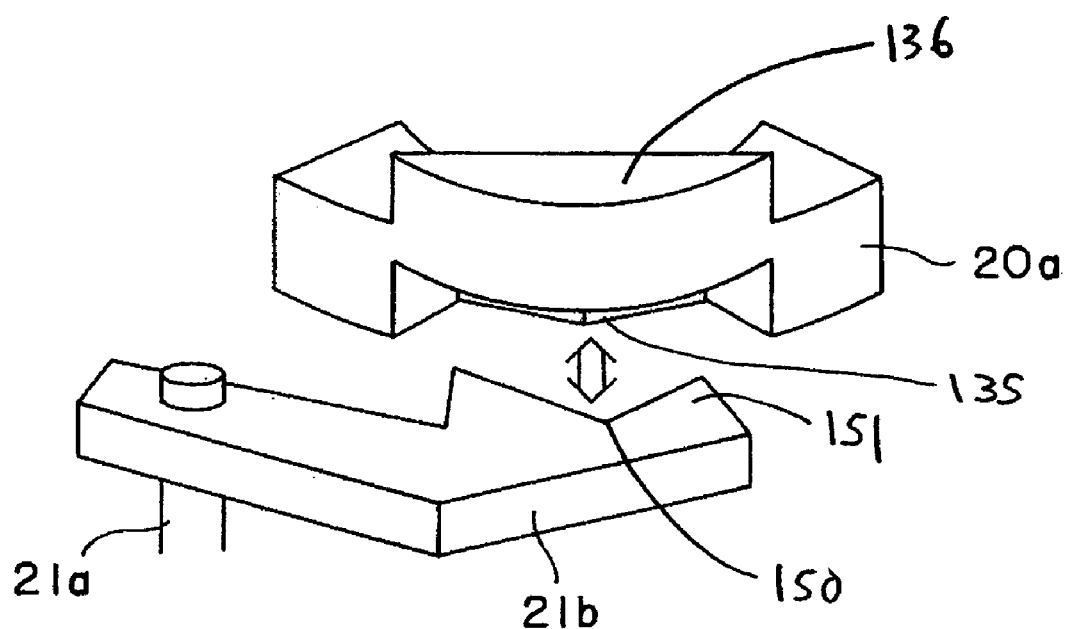
FIG. 4 is a plane view for illustrating a configuration and the operation of the supporting means according to an embodiment of the present invention.

Referring to FIG. 4, in this embodiment, each supporting mechanism 21 has a drive shaft 21a extending to upward and downward directions and a supporting arm 21b fixed in the vicinity of the tip of the drive shaft 21a. At the heel of the drive shaft 21a, a drive source not shown in the figure such as a motor or a rotary actuator is provided, and the supporting arm 21b is capable of turning in a horizontal direction. In other words, the tip of the supporting arm 21b is capable of advancing/retracting with respect to the moving space of the susceptor 19.

When the susceptor 19 is stopped in an appropriate position (the "block attaching/detaching position") and the supporting arm 21b is turned toward the susceptor 19 (the "inward direction"), the tip of the supporting arm 21b is inserted into an indentation formed in the block member 20a (or 20b; the same applies to below.) to support the block member 20a. At this time, because the center of gravity of the block member 20a lies on the supporting arm 21b (regardless of whether the wafer is placed on the block member), there is no possibility that the block member 20a comes off from the supporting arm 21b although the block member is a free block. A central step portion 136 of the block member is a weight for shifting the center of gravity toward the supporting arm, and preferably, the recess is formed under the central step portion 136.

If the susceptor 19 is sent down in this condition, the block member 20a can be detached from the susceptor 19. Subsequently, the susceptor 19 is sent up again, the block member 20a can be attached to the susceptor 19. In this position, if the supporting arm 21b is turned in a direction of separating from the susceptor 19 (the "outward direction"), the block member 20a can be released from being supported by the supporting arm 21b.

In this preferred embodiment, the supporting arm 21b has two convexes 151, i.e., one concave 150 which can be fitted to a convex 135 of the block member 20a so that when the block member 20a and the supporting arm 21b are engaged, the positional relationship therebetween can always be constant. That is, due to the convexes and concaves, even if the position of the block member is slightly out of place, such a misposition can be fixed by pushing the placing block by the supporting mechanism 21 toward the susceptor. The engaging shapes of the block member and the supporting arm are not limited to the above. As long as the shapes are such that a misposition is fixed by movement of the supporting arm, any shape can be employed. For example, the block member can have one concave which corresponds to one convex provided in the supporting arm.

Additionally, in order to prevent the block member 20a attached to the susceptor 19 from moving with turning of the supporting arm 21b, a part of the block member 20a (e.g., a protrusion formed on an undersurface and so forth) may be configured to be housed in a housing portion (e.g., a concave portion) formed in the susceptor 19.

Referring to FIGS. 5(a)-(d), the operation of the semiconductor-processing apparatus according to the present invention is described below. Of the operation, carrying out a processed semiconductor wafer for which the processing has been completed and introducing an unprocessed semiconductor wafer which is processed next are described here.

FIG. 5(a) shows a position in which the processing (thin film formation) of a semiconductor wafer 23 is conducted. At this time, the placing block 20 is attached to the susceptor 19; the semiconductor wafer 23 is placed on them. Additionally, the reaction area 11 is divided airtightly from the transfer area by the separation plate 14, the susceptor 19 and the seal mechanism 22.

In this mode, the semiconductor wafer 23 is heated by the heater 18 (e.g., at 50-500° C.), and a source gas heated (e.g., at 50-500° C.) by the showerhead 16 is supplied into the reaction area. When introduction of the source gas is finished, the source gas is evacuated through the exhaust duct 15. As described above, because the reaction area 11 is divided from the transfer area airtightly, source gas evacuation is conducted only for the reaction area, and hence the evacuation is finished in a short time.

A secondary source gas is introduced into the reaction area 11, a thin film is formed on the semiconductor wafer 23, and the secondary source gas is evacuated.

Subsequently, the above operation is repeated according to need and a thin film having a given film thickness is formed on the semiconductor wafer 23.

Figure 5B:
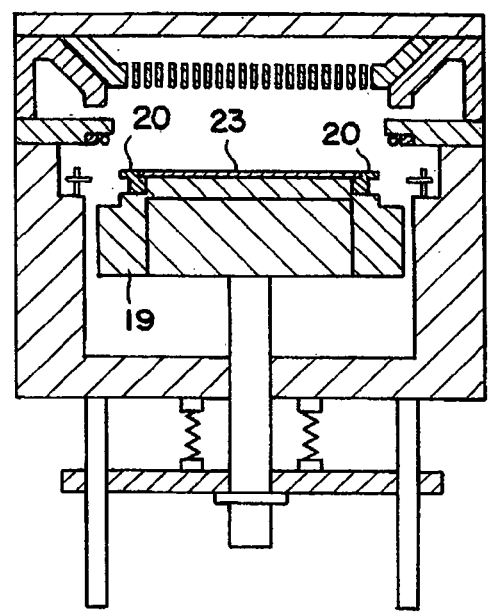

When the thin film formation is finished and evacuation of the last source gas is completed, as shown in FIG. 5(b), the susceptor 19 is sent down together with the placing block 20 and the semiconductor wafer 23 to the block attaching/detaching position.

Figure 5C:
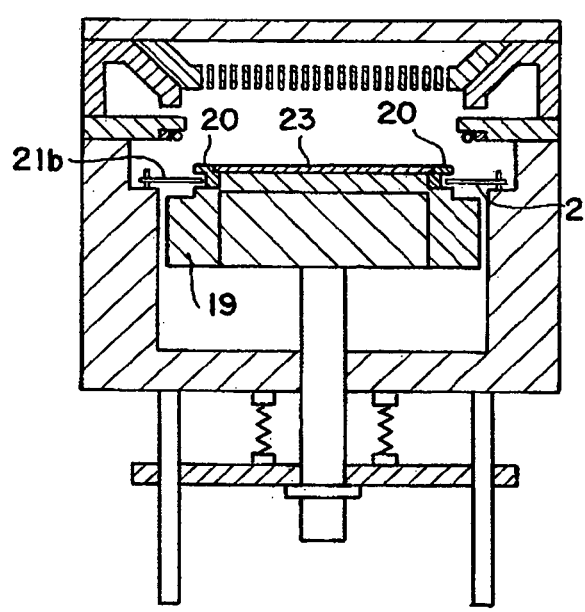

The supporting arm 21b of the supporting mechanism 21 is turned toward the susceptor 19 (the placing block 20) to let the supporting arm 21b support the placing block 20 as shown in FIG. 5(c).

Figure 5D:
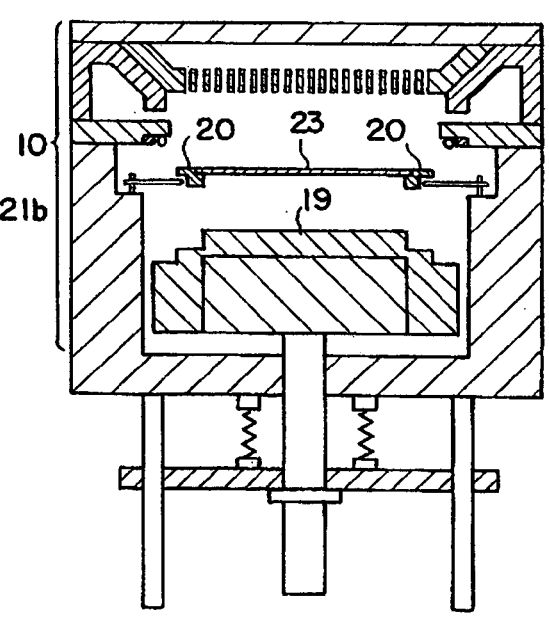

As shown in FIG. 5(d), the susceptor 19 is sent down to the transfer position; the placing block 20 is detached from the susceptor 19. As described above, because the placing blocks 20a and 20b are symmetrically disposed with respect to the center of the susceptor 19, i.e., symmetrically disposed with respect to the center of the semiconductor wafer 23, there is no possibility that the semiconductor wafer 23 comes off from the placing block 20.

The semiconductor wafer 23 is transferred using a transfer arm not shown in the figure from the chamber 10, for example, to a load lock chamber (not shown) via a gate valve (not shown).

Subsequently, an unprocessed semiconductor wafer to be processed next is introduced from the load lock chamber, etc. into the chamber 10 and is placed on the placing block 20 being supported by the supporting arm 21b. This position is the same as the position shown in FIG. 5(d). The transfer area is separated from the load lock chamber, etc. by closing the gate valve, etc.

The susceptor 19 is sent up to the block attaching/detaching position, and the placing block 20 is attached to the susceptor 19 (FIG. 5(c)). By this, the unprocessed semiconductor wafer is placed on the susceptor 19.

The supporting arm 21b is turned in the outward direction (FIG. 5(b)). By this, the placing block 20 is released from being supported by the supporting arm 21b.

Subsequently, the susceptor 19 is sent up to the reaction position; the unprocessed semiconductor wafer is positioned inside the reaction area 11 which is completely separated from the transfer area 12 (FIG. 5(a)).

As described above, in the semiconductor-processing apparatus according to the present invention, by providing the placing block detachably attached to the susceptor 19, introducing and carrying out of the semiconductor wafer can be achieved without using lift pins. By this, a gap between the reaction area and the transfer area can be sealed airtightly by the seal mechanism, thereby accomplishing shortening of a purge time (improvement of processing efficiency) and preventing the semiconductor wafer from being moved by a differential pressure. Additionally, particle generation caused by a reaction gas flowing into the transfer area can be prevented. Further, film formation in the transfer area is prevented, thereby achieving prolongation of a maintenance cycle.

Referring to FIGS. 6 to 10, a semiconductor-processing apparatus according to Embodiment 2 of the present invention is described below.

Figure 6A:
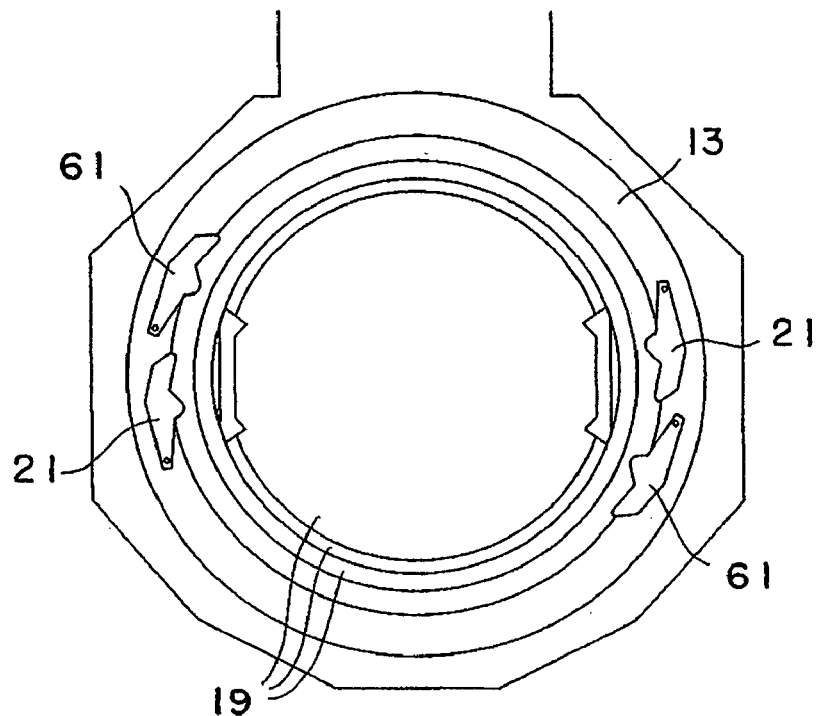
FIG. 6(a) is a plane view for illustrating a layout of the buffer mechanism, and FIG. 6(b) a cross-sectional view for illustrating the drive mechanism for rotating and moving the buffer mechanism up and down according to an embodiment of the present invention.

A basic configuration of the semiconductor-processing apparatus according to this embodiment is the same as that of the semiconductor-processing apparatus shown in FIG. 1. However, the semiconductor-processing apparatus according to this embodiment, as shown in FIG. 6(a), has a pair of buffer mechanisms 61 provided on a step portion of the container 13 symmetrically with respect to the center of the susceptor, similarly to the supporting mechanism.

Figure 6B:
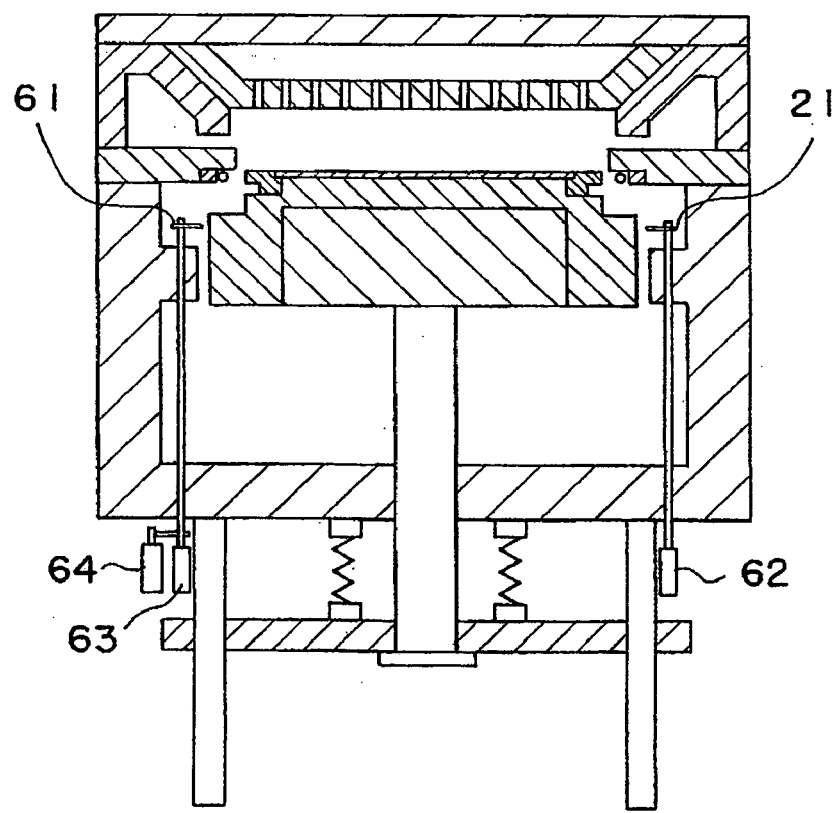
Figure 7:
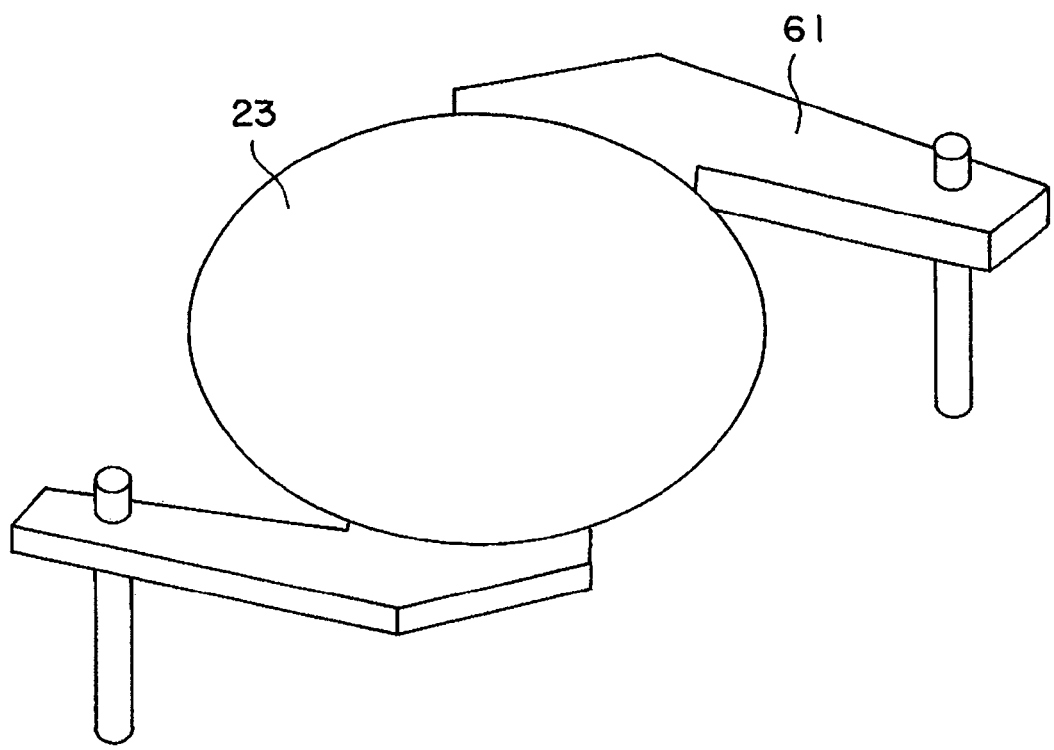
FIG. 7 is a perspective view showing a position in which the semiconductor wafer is supported by the buffer mechanism according to an embodiment of the present invention.

As shown in FIG. 6(b), as against a rotary actuator 62 being provided at the back end of the supporting mechanism 21 as a rotation drive source, in addition to a rotary actuator 63 provided as a rotation drive source, a cylinder mechanism 64 for driving the drive shaft of the buffer mechanism 61 up and down is provided at the back end of the buffer mechanism 61. Additionally, in FIG. 6(b), positions of the supporting mechanism 21 and the buffer mechanism 61 are different from those shown in FIG. 6(a).

In this embodiment, although the buffer mechanism 61 looks the same as the supporting mechanism 21, it possesses a holding arm having a tip capable of directly holding or placing a semiconductor wafer 23, i.e., independently of a placing block. The holding arm of the buffer mechanism 61 is capable of advancing/retracting with respect to a moving space of the susceptor 19 (capable of turning in a horizontal direction). For example, the buffer mechanism 61 is able to support the semiconductor wafer in a position shown in FIG. 7. The shape of the buffer arm can be but need not be the same as the supporting arm of the supporting mechanism. Preferably, the arm has a fork or convexes for stably supporting a wafer. The number of the arm need not be two and can be one or more than two, depending on their shapes.

Preferably, the position of the buffer arm 61 may be in the vicinity of the supporting arm 21 so that a robot arm for transferring a wafer can access a wafer placed on the buffer arm or the supporting arm without interference with the buffer arm or the supporting arm. For example, these arms are not arranged in front of the gate between a load lock chamber and the transfer area. The buffer arms are preferably arranged symmetrically with respect to the center of the susceptor. However, in the case where three or more arms are used, symmetrical arrangement is not necessary as long as the arm can support a wafer stably. The size of the buffer arm may be similar to that of the block member or that of the supporting arm.

The operation of this semiconductor-processing apparatus is described below.

Figure 8A:
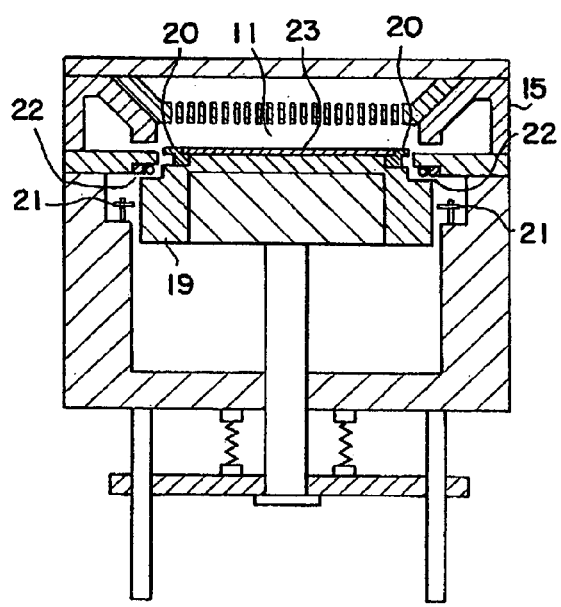
FIGS. 8(a)-(d) are process drawings for illustrating the operation of carrying out a processed semiconductor wafer from the chamber and introducing an unprocessed semiconductor wafer into the chamber according to an embodiment of the present invention.

Similarly to FIG. 5(a), FIG. 8(a) shows a position in which processing the semiconductor wafer 23 has been finished. In this position, a reaction gas inside the reaction area 11 is evacuated through the exhaust duct 15.

Figure 8B:
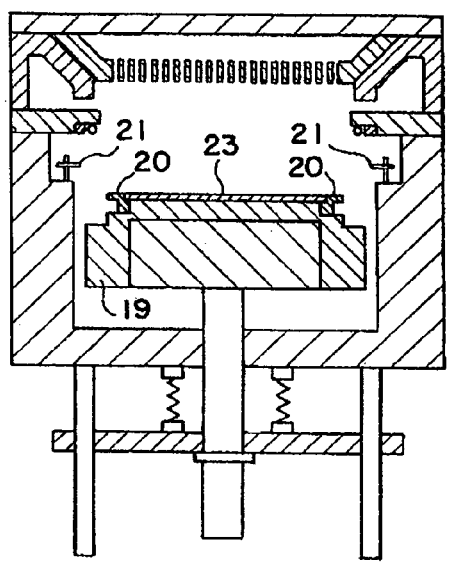
Figure 8C:
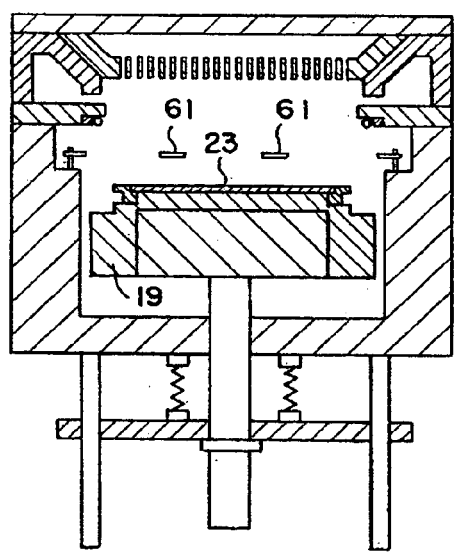
Figure 8D:
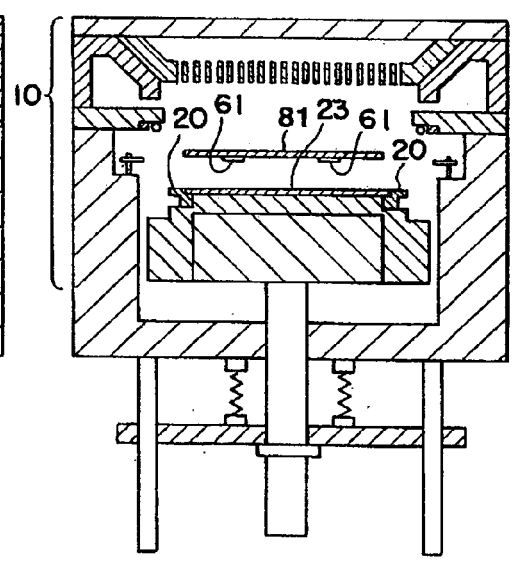
Figure 9A:
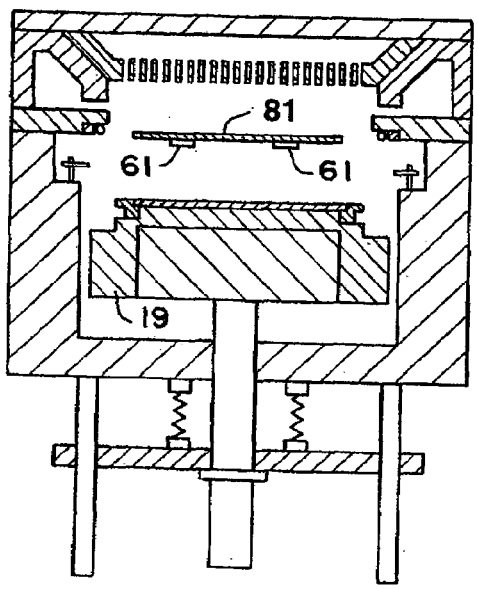
FIGS. 9(a)-(d) are process drawings for illustrating the operation of carrying out the processed semiconductor wafer from the chamber and introducing the unprocessed semiconductor wafer into the chamber; these process drawings are for illustrating subsequent steps to those shown in FIG. 8 according to an embodiment of the present invention.
Figure 9B:
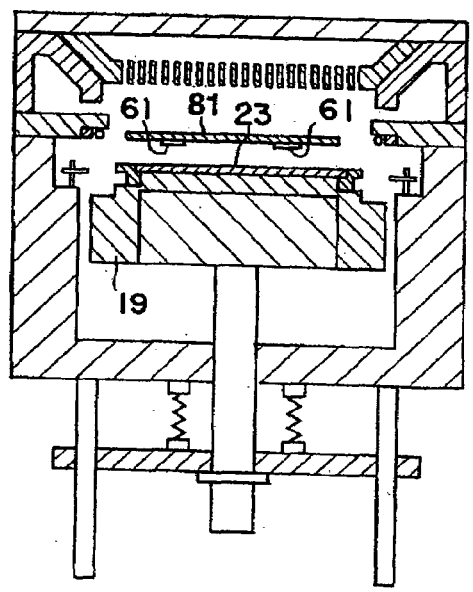
Figure 9C:
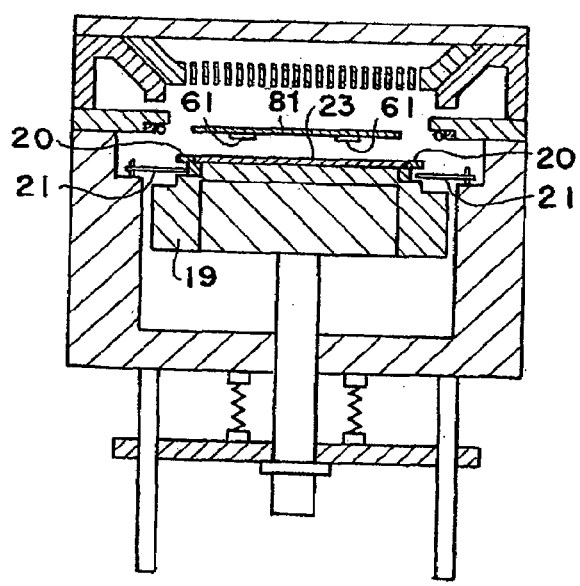
Figure 9D:
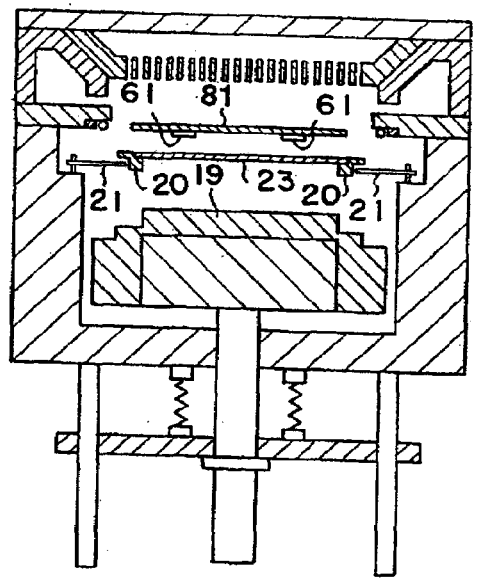
Figure 10A:
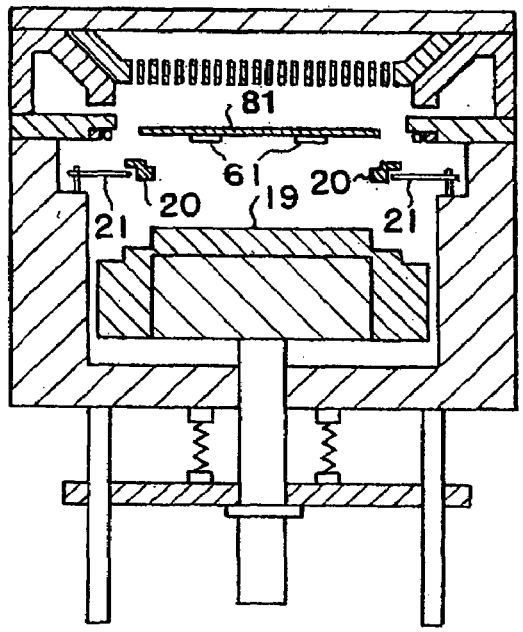
FIGS. 10(a)-(d) are process drawings for illustrating the operation of carrying out the processed semiconductor wafer out of the chamber and introducing the unprocessed semiconductor wafer into the chamber; these process drawings are for illustrating subsequent steps to those shown in FIG. 9 according to an embodiment of the present invention.
Figure 10B:
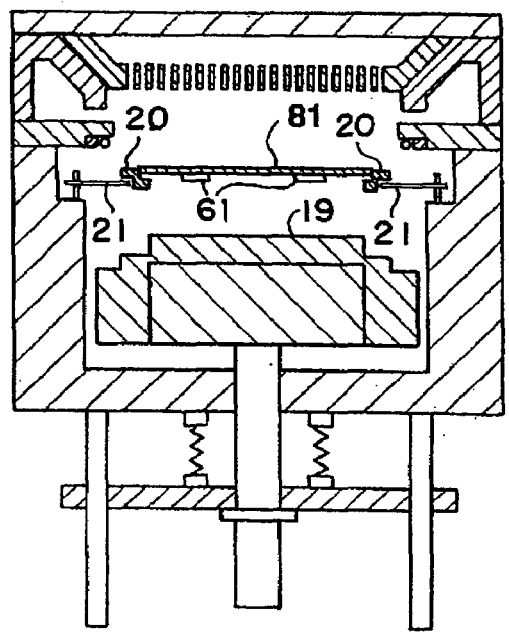
Figure 10C:
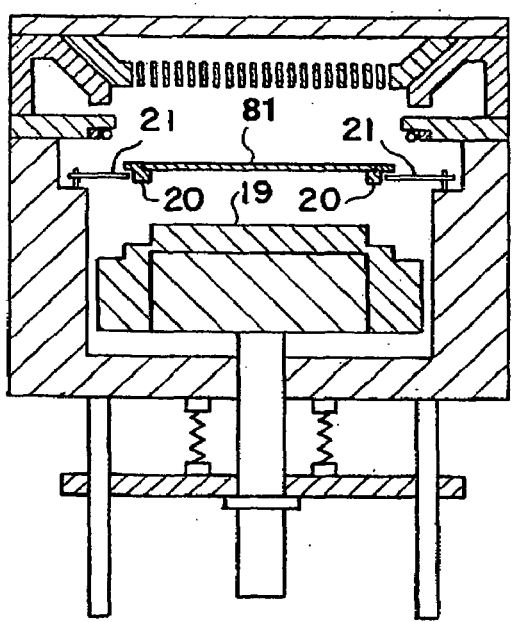
Figure 10D:
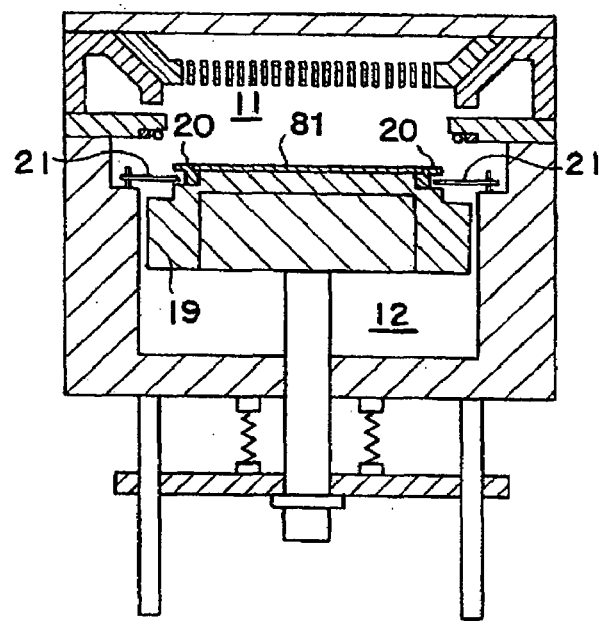
Figure 11:
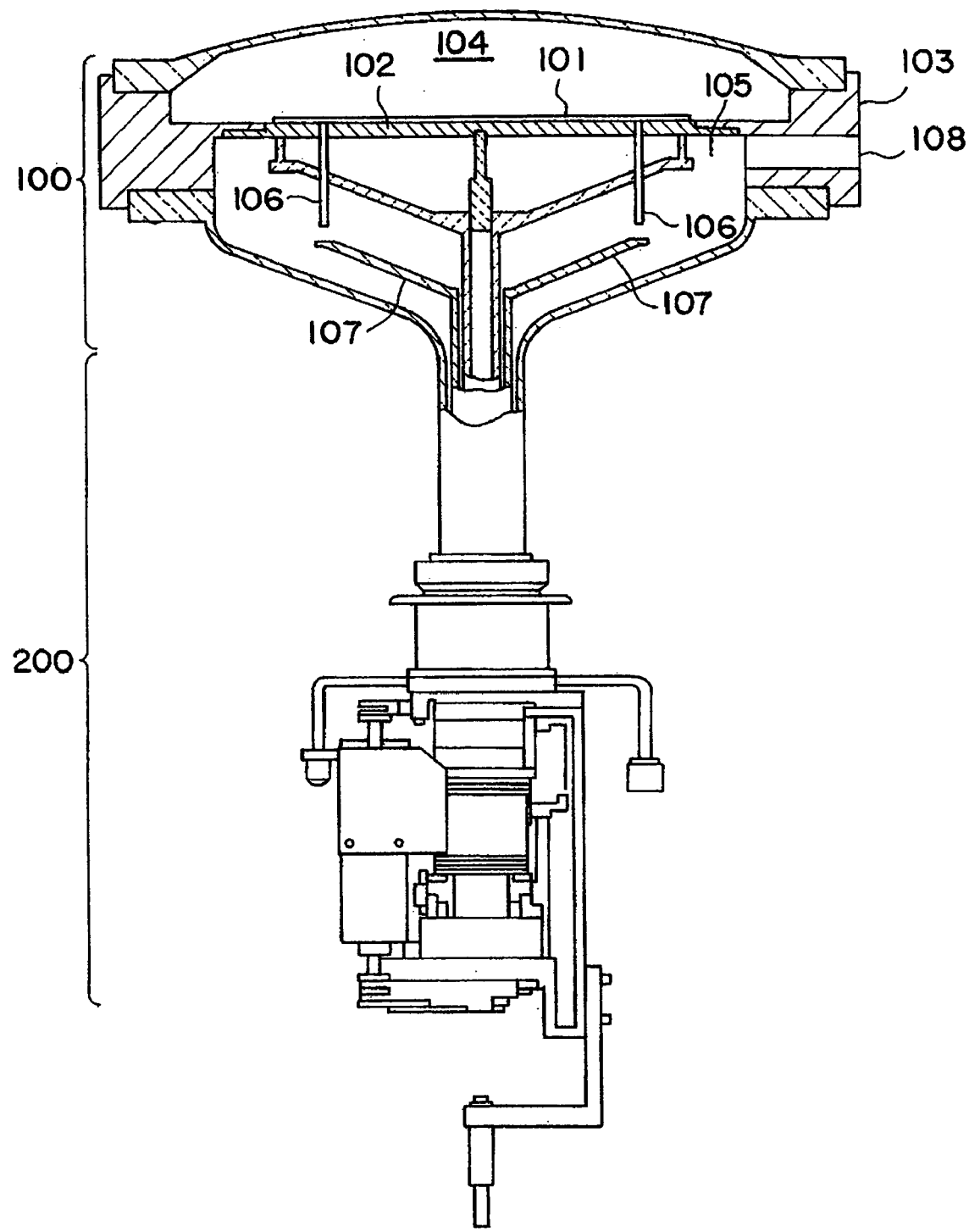
FIG. 11 is a cross-sectional view showing one configuration example for conventional semiconductor-processing apparatuses.

When the evacuation is completed, as shown in FIG. 8(b), the susceptor 19 is sent down to the transfer position. As shown in FIG. 8(c), the holding arm of the buffer mechanism 61 is turned in the inward direction. At this time, the buffer mechanism 61 is in a descent position (its own descent position which is different from the descent position of the susceptor 19). Additionally, a position of the buffer mechanism 61 shown in FIG. 8(c) is different from that shown in FIGS. 6(a) and (b).

An unprocessed semiconductor wafer 81 which is ready in a load lock chamber (not shown) connected with the chamber 10 via a gate valve (not shown) is introduced into the chamber 10 by a transfer arm (not shown). The unprocessed semiconductor wafer 81 introduced into the chamber 10 is held by the holding arm of the buffer mechanism 61 as shown in FIG. 8(*d*) (See FIG. 7.).

As shown in FIG. 9(*a*), the holding arm of the buffer mechanism 61 is sent up to an ascent position (its own ascent position which is different from the ascent position of the susceptor 19). Simultaneously or continuously, as shown in FIG. 9(*b*), the susceptor 19 is send up to the block attaching/detaching position. Additionally, when the susceptor 19 is in the block attaching/detaching position, the holding arm of the buffer mechanism 61 has to be positioned not to contact a processed semiconductor wafer placed on the susceptor.

Subsequently, by turning the supporting arm of the supporting mechanism 21 in the inward direction, as shown in FIG. 9(*d*), the susceptor 19 is sent down to the transfer position; the placing block 20 is detached from the susceptor 19. Using a transfer arm not shown in the figure, the processed semiconductor wafer 23 placed on the placing block 20 which is detached from the susceptor 19 is transferred to the load lock chamber; FIG. 10(*a*) shows a position upon transferring of the processed semiconductor wafer 23. As shown in FIG. 10(*b*), the holding arm of the buffer mechanism 61 is sent down to the descent position. When the holding arm of the buffer mechanism 61 is turned in the outward direction, the unprocessed semiconductor wafer 81 is placed on the placing block 20 supported by the supporting mechanism 21.

Subsequently, as shown in FIG. 10(*d*), the susceptor 19 is sent up to the block attaching/detaching position. When the supporting arm of the supporting mechanism 21 is turned in the outward direction in this position, the placing block is released from being supported by the supporting mechanism 21.

Subsequently, when the susceptor 19 is sent up to the reaction position, the unprocessed semiconductor wafer 81 is placed within the reaction area. When the susceptor 19 is in the reaction position, a gap between the separation plate 14 and the susceptor 19 is sealed by the seal mechanism 22, thereby dividing the reaction area 11 and the transfer area 12 airtightly.

In the semiconductor-processing apparatus according to this embodiment as well, introducing and carrying out of the semiconductor wafer can be achieved without using lift pins. By this, a gap between the reaction area and the transfer area can be sealed airtightly by the seal mechanism, thereby accomplishing shortening of a purge time (improvement of processing efficiency) and preventing the semiconductor wafer from being moved by a differential pressure. Additionally, particle generation caused by a reaction gas flowing into the transfer area can be prevented. Further, film formation in the transfer area is prevented, thereby achieving prolongation of a maintenance cycle. Additionally, in the semiconductor-processing apparatus according to this embodiment, because an unprocessed semiconductor wafer to be processed next can be introduced into the chamber when a processed semiconductor wafer is carried out, further improvement of processing efficiency can be achieved.

In the semiconductor-processing apparatus according to an embodiment of the present invention, by placing a semiconductor wafer on the placing block detachably attached to the susceptor, transferring (introducing and carrying out) the semiconductor wafer without using lift pins becomes possible. Additionally, in an embodiment, because the seal member is disposed between the separation plate and the susceptor, a gap between them can be eliminated. By this, in at least one embodiment, the semiconductor-processing apparatus according to the present invention is capable of dividing the reaction area and the transfer area inside the chamber airtightly.

Additionally, in an embodiment of the method for introducing a semiconductor wafer according to the present invention, by using the placing block, or by using the placing block and the buffer means, transferring the semiconductor wafer without using lift pins becomes possible. By this, in at least one embodiment, by sealing a gap between the separation plate and the susceptor by the seal member, the reaction area and the transfer area can be divided airtightly.

This application claims priority under 35 U.S.C. § 119 to Japanese Patent Application No. 2003-280872, filed on Jul. 28, 2003, the disclosure of which is incorporated herein by reference in its entirety.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A semiconductor-processing apparatus comprising:
a chamber prescribing a reaction area and a transfer area;
a susceptor provided inside the chamber and having a substrate-supporting surface for placing a semiconductor substrate thereon, said susceptor being movable between the reaction area and the transfer area;
an annular separation plate disposed at a boundary between the reaction area and the transfer area and having a central opening which is closed by upward movement of the susceptor;
removable placing blocks detachably placed at a periphery of the substrate-supporting surface of the susceptor, for placing the substrate thereon;
retractable supporting members each for supporting/releasing the placing blocks at a position where the substrate is in the transfer area to detach/attach the placing blocks from/to the susceptor, said supporting members being provided in the chamber outside a periphery of the susceptor where the supporting members do not interfere with movement of the susceptor when the supporting members are retracted; and
a seal member for sealing a gap between the susceptor and the separation plate when the central opening of the separation plate is closed by the susceptor.

2. The semiconductor-processing apparatus according to claim 1, wherein the placing blocks are configured to be supported on the supporting members when the placing blocks are separated from the susceptor.

3. The semiconductor-processing apparatus according to claim 2, wherein each placing block has an inner side to be fitted to the periphery of the substrate-supporting surface of the susceptor and an outer side to be in contact with the supporting member, said outer side having a recess where the supporting member enters to support the placing block.

4. The semiconductor-processing apparatus according to claim 3, wherein the inner side of the placing block has a convex/concave and the susceptor has a concave/convex corresponding to the convex/concave of the inner side of the placing block.

5. The semiconductor-processing apparatus according to claim 1, wherein the supporting member comprises a retractable arm for supporting/releasing the placing block.

6. The semiconductor-processing apparatus according to claim 5, wherein the retractable arm is comprised of a rotatable arm and a drive shaft, wherein the rotatable arm moves on a plane perpendicular to an axis of the susceptor.

7. The semiconductor-processing apparatus according to claim 6, wherein the rotatable arm does not move in a direction of the axis of the susceptor.

8. The semiconductor-processing apparatus according to claim 6, wherein the rotatable arm has a convex/concave and the placing block has a concave/convex on the outer side corresponding to the convex/concave of the rotatable arm.

9. The semiconductor-processing apparatus according to claim 6, wherein the plane perpendicular to the axis of the susceptor is disposed at a substrate-transferring position.

10. The semiconductor-processing apparatus according to claim 1, wherein the placing blocks are placed around the periphery of the substrate-supporting surface of the susceptor at equal intervals.

11. The semiconductor-processing apparatus according to claim 1, wherein the placing blocks are placed symmetrically with respect to a center of the substrate-supporting surface of the susceptor.

12. The semiconductor-processing apparatus according to claim 1, wherein the number of the placing blocks is two.

13. The semiconductor-processing apparatus according to claim 1, wherein each placing block has a length along the periphery of the substrate-supporting surface of the susceptor, which is about 1/16 to about 1/6 of the length of the periphery of the substrate-supporting surface of the susceptor.

14. The semiconductor-processing apparatus according to claim 1, wherein the seal member is provided on a backside of the separation plate.

15. The semiconductor-processing apparatus according to claim 1, wherein the susceptor has a first annular steps outward of the substrate-supporting surface for mounting the placing blocks thereon, and a second annular step outward of the first annular step for contacting a backside of the separation plate.

16. The semiconductor-processing apparatus according to claim 1, wherein the substrate-supporting surface of the susceptor has no hole for pin rifting.

17. The semiconductor-processing apparatus according to claim 1, which is a plasma or thermal atomic layer CVD (ALCVD) apparatus.

18. The semiconductor-processing apparatus according to claim 1, further comprising a buffer mechanism for simultaneously placing the substrate, which is a first substrate, and a second substrate inside the chamber.

19. The semiconductor-processing apparatus according to claim 18, wherein the buffer mechanism comprises retractable arms for supporting the second substrate, said retractable arms being movable between an initial position where the second substrate is loaded on the retractable arms and an upper position where the first substrate is unloaded from the placing blocks.

20. The semiconductor-processing apparatus according to claim 19, wherein the retractable arms are disposed where the retractable arms do not interfere with movement of the susceptor when the retractable arms are retracted.

21. The semiconductor-processing apparatus according to claim 20, wherein each retractable arm is comprised of a rotatable arm and a drive shaft, wherein the rotatable arm moves on a plane perpendicular to an axis of the susceptor.

22. A semiconductor-processing apparatus comprising:
a chamber prescribing a reaction area and a transfer area;
a susceptor provided inside the chamber for placing a semiconductor wafer thereon;
an elevating drive for moving the susceptor in a given direction;
an annular separation plate disposed at a boundary between the reaction area and the transfer area and having a central opening to be closed by movement of the susceptor;
a placing block for placing the semiconductor wafer thereon, which is detachably attached to the susceptor;
a supporting member for supporting/releasing the placing block in a given position and detaching/attaching the placing block from/to the susceptor; and
a seal member provided on a surface of the separation plate facing the susceptor and used for sealing a gap between the susceptor and the separation plate when the susceptor closes the opening of the separation plate.

23. The semiconductor-processing apparatus according to claim 22, wherein the seal member is an O-ring, bellows, or a coil spring covered with an aluminum material having a C-shaped section.

24. The semiconductor-processing apparatus according to claim 22, wherein the placing block comprises the same material as a material used for a top portion of the susceptor.

25. The semiconductor-processing apparatus according to claim 24, wherein the material is surface anode-treated aluminum oxide, aluminum oxide, aluminum nitride, silicon carbide, graphite, or quartz.

26. The semiconductor-processing apparatus according to claim 22, wherein the supporting member is provided outside a moving space of the susceptor and comprises multiple supporting arms respectively having a tip capable of advancing/retracting with respect to the moving space.

27. The semiconductor-processing apparatus according to claim 22, further comprising a buffer mechanism for allowing the semiconductor wafer and a second semiconductor wafer to simultaneously exist inside the chamber, said buffer mechanism being provided for supporting the second wafer independently of the placing block and the supporting means.

28. The semiconductor-processing apparatus according to claim 27, wherein the buffer mechanism is provided outside a moving space of the susceptor and comprises (i) multiple holding arms respectively having a tip capable of advancing/retracting with respect to the moving space and (ii) a moving member for moving the multiple arms in a given direction.

29. A semiconductor-processing apparatus comprising:
a chamber prescribing a reaction area and a transfer area;
a susceptor having a substrate-supporting surface for placing a semiconductor substrate thereon, said susceptor being provided inside the chamber and movable in its axis between a top position and a bottom position via an intermediate position, said substrate-supporting surface having no throughhole;
an annular separation plate disposed at a boundary between the reaction area and the transfer area and having a central opening to be closed by movement of the susceptor, said separation plate having a backside provided with a seal member for sealing a gap between the separation plate and the susceptor when at the top position; and
placing blocks for placing the substrate thereon, said placing blocks detachably attached to the susceptor, wherein the placing blocks moves together with the susceptor while the susceptor moves between the top position and the intermediate position, and the placing blocks stays at the intermediate position while the susceptor moves between the intermediate position and the bottom position, wherein the substrate is loaded and unloaded when the susceptor is at bottom position.

30. The semiconductor-processing apparatus according to claim 29, further comprising retractable supporting members each for supporting/releasing the placing blocks at the intermediate position to detach/attach the placing blocks from/to the susceptor, wherein the supporting members are provided in the chamber outside a periphery of the susceptor where the supporting members do not interfere with movement of the susceptor when the supporting members are retracted.

31. A semiconductor-processing apparatus comprising:
   a chamber prescribing a reaction area and a transfer area;
   a susceptor having a substrate-supporting surface for placing a semiconductor substrate thereon, said susceptor being provided inside the chamber and movable in its axis between a top position and a bottom position via an intermediate position, said substrate-supporting surface having no throughhole;
   an annular separation plate disposed at a boundary between the reaction area and the transfer area and having a central opening to be closed by movement of the susceptor, said separation plate having a backside provided with a seal member for sealing a gap between the separation plate and the susceptor when at the top position;
   placing blocks for placing the substrate thereon, said placing blocks detachably attached to the susceptor, wherein the placing blocks is movable together with the susceptor, and the placing blocks is detached or attached to the susceptor at the intermediate position;
   a buffer mechanism for simultaneously placing the substrate, which is a first substrate, and a second substrate inside the chamber.

32. The semiconductor-processing apparatus according to claim 31, wherein the buffer mechanism comprises retractable arms for supporting the second substrate, said retractable arms being movable between the intermediate position where the second substrate is loaded on the retractable arms and an upper position where the first substrate is unloaded from the placing blocks.

33. The semiconductor-processing apparatus according to claim 32, wherein the retractable arms are disposed where the retractable arms do not interfere with movement of the susceptor when the retractable arms are retracted.

* * * * *